(12) United States Patent
Cho

(10) Patent No.: US 12,211,882 B2
(45) Date of Patent: Jan. 28, 2025

(54) DISPLAY DEVICE

(71) Applicant: Samsung Display Co., Ltd., Yongin-si (KR)

(72) Inventor: Seong Heon Cho, Incheon (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 499 days.

(21) Appl. No.: 17/501,945

(22) Filed: Oct. 14, 2021

(65) Prior Publication Data
US 2022/0123045 A1    Apr. 21, 2022

(30) Foreign Application Priority Data

Oct. 15, 2020 (KR) .......................... 10-2020-0133543

(51) Int. Cl.
*H01L 27/15* (2006.01)
*G09G 3/32* (2016.01)

(52) U.S. Cl.
CPC ............ *H01L 27/156* (2013.01); *G09G 3/32* (2013.01); *G09G 2300/0842* (2013.01); *G09G 2310/0267* (2013.01); *G09G 2310/08* (2013.01); *G09G 2320/02* (2013.01)

(58) Field of Classification Search
None
See application file for complete search history.

(56) References Cited

U.S. PATENT DOCUMENTS

| 8,427,420 | B2 * | 4/2013 | Yamazaki | ............ G09G 3/3648 345/100 |
| 9,632,334 | B2 | 4/2017 | Cho et al. | |
| 10,120,227 | B2 | 11/2018 | Yu et al. | |
| 10,488,717 | B2 | 11/2019 | Kim et al. | |
| 10,768,883 | B2 | 9/2020 | Jeong | |
| 10,915,145 | B2 * | 2/2021 | Yamazaki | ................ G09G 3/20 |
| 2013/0314346 | A1 * | 11/2013 | Yamazaki | ............ G09G 3/3648 345/173 |
| 2015/0355680 | A1 * | 12/2015 | Yamazaki | ............ G06F 1/1643 361/679.27 |
| 2016/0042691 | A1 * | 2/2016 | Na | ......... G11C 19/28 345/82 |
| 2016/0274623 | A1 * | 9/2016 | Yamazaki | ............ G06F 1/1647 |

(Continued)

FOREIGN PATENT DOCUMENTS

| KR | 10-2015-0067553 | 6/2015 |
| KR | 10-2015-0111808 | 10/2015 |

(Continued)

*Primary Examiner* — Fred Tzeng
(74) *Attorney, Agent, or Firm* — CANTOR COLBURN LLP

(57) ABSTRACT

A display device includes a first display panel; and a second display panel, wherein the first display panel includes a first substrate including a first region and a second region that is thinner than the first region, a first scan driver positioned on one edge of the first region, a second scan driver positioned in the second region, and a plurality of pixels connected to the first scan driver and the second scan driver by a scan line, the second display panel includes a second substrate including a first region and a second region that is thinner than the first region, a first scan driver positioned on one edge of the first region, and a plurality of pixels connected to the first scan driver by a scan line.

18 Claims, 25 Drawing Sheets

(56) References Cited

U.S. PATENT DOCUMENTS

| | | |
|---|---|---|
| 2017/0309698 A1 | 10/2017 | Bower et al. |
| 2019/0304392 A1* | 10/2019 | Yeh .................. G09G 3/3266 |
| 2020/0126485 A1* | 4/2020 | Moon ................ G09G 3/3258 |
| 2022/0157894 A1* | 5/2022 | Choi .................. H10K 50/844 |

FOREIGN PATENT DOCUMENTS

| | | |
|---|---|---|
| KR | 10-2017-0015773 | 2/2017 |
| KR | 10-2017-0039030 | 5/2017 |
| KR | 10-2017-0132954 | 12/2017 |

* cited by examiner

DISPLAY DEVICE

CROSS-REFERENCE TO RELATED APPLICATION

This application claims priority from and the benefit of Korean Patent Application No. 10-2020-0133543 filed on Oct. 15, 2020, which is hereby incorporated by reference for all purposes as if fully set forth herein.

BACKGROUND

Field

Exemplary embodiments and implementations of the invention relate generally to a display device, and more specifically, it relates to a display device in which a plurality of display panels are connected to each other.

Discussion of the Background

Tiled displays in which a plurality of display devices are connected are commercialized so as to manufacture big-screen display devices, and are used as billboards. The tiled display realizes the big screen by fixing a plurality of display panels with a predetermined size to an installation frame.

When this is done, gaps among pixels of the display panel may be changed by a configurational element, such as a driver, around a boundary portion between one display panel and another display panel. In cases such as this, display quality of the tiled display may be deteriorated.

The above information disclosed in this Background section is only for enhancement of understanding of the background of the invention, and therefore it may contain information that does not form the prior art that is already known in this country to a person of ordinary skill in the art.

SUMMARY

The present invention provides a display device configured to improve display quality in a display device in which a plurality of display panels are connected to each other.

Additional features of the inventive concepts will be set forth in the description which follows, and in part will be apparent from the description, or may be learned by practice of the inventive concepts.

An embodiment of the present invention provides a display device including a first display panel; and a second display panel, wherein the first display panel includes a first substrate including a first region and a second region that is thinner than the first region, a first scan driver positioned on one edge of the first region, a second scan driver positioned in the second region, and a plurality of pixels connected to the first scan driver and the second scan driver by a scan line, the second display panel includes a second substrate including a first region and a second region that is thinner than the first region, a first scan driver positioned on one edge of the first region, and a plurality of pixels connected to the first scan driver by a scan line, a second region of the first substrate, a second scan driver of the first display panel, and a second region of the second substrate overlap each other in a perpendicular direction to a side of the first substrate, and the second scan driver of the first display panel is not visible from the outside.

The second scan driver of the first display panel may be positioned between the second region of the first substrate and the second region of the second substrate.

The display device may further include a second scan driver positioned on a rear side of the second region of the second display panel.

The display device may further include an insulating layer positioned between the second scan driver of the first display panel and the second scan driver of the second display panel.

The second scan driver of the second display panel may not be visible from the outside of the display device.

The scan line of the second display panel may extend to a rear side of the second region, and the scan line of the second display panel may directly contact the second scan driver of the first display panel.

The scan line of the second display panel may be positioned between the second scan driver of the first display panel and the second region of the second display panel.

The pixel may be positioned in the first region and may not be positioned in the second region on the first display panel, and the pixel may be positioned in the first region and the second region on the second display panel.

A difference between a gap among pixels positioned on the first display panel and a gap between the pixel positioned on the first display panel and the pixel positioned on the second display panel neighboring each other near an overlapping portion of the first display panel and the second display panel may be equal to or less than 10%.

Another embodiment of the present invention provides a display device including a first display panel; a second display panel; and a third display panel positioned between the first display panel and the second display panel, wherein the first display panel includes a first substrate including a first region and a second region that is thinner than the first region, a first scan driver positioned on one edge of the first region, a second scan driver positioned in the second region, and a plurality of pixels connected to the first scan driver and the second scan driver by a scan line, the second display panel includes a second substrate including a first region and a second region that is thinner than the first region, a first scan driver positioned on one edge of the first region, a plurality of pixels connected to the first scan driver by a scan line, the third display panel includes a third substrate including a first region and a second region that is thinner than the first region, a scan line positioned on the third substrate, and a plurality of pixels connected to the scan line, the second region is positioned on respective edges of the first region, a second region of the first substrate, a second scan driver of the first display panel, and a second region of the third substrate overlap each other in a perpendicular direction to a side of the first substrate, and the second scan driver of the first display panel is not visible from the outside.

A second region of the second substrate and a second region of the third substrate may overlap each other in a perpendicular direction to a side of the first substrate.

A second scan driver of the first display panel may be positioned between the second region of the first substrate and the second region of the third substrate.

The display device may further include a first scan driver positioned on a rear side of the second region of the third display panel, wherein the first scan driver of the third display panel may overlap the second scan driver of the first display panel in a perpendicular direction to a side of the first substrate.

The display device may further include an insulating layer positioned between the second scan driver of the first display panel and the first scan driver of the third display panel.

The display device may further include a second scan driver positioned in the second region of the third display panel; and a second scan driver positioned on a rear side of the second region of the second display panel, wherein the second scan driver of the third display panel may overlap the second scan driver of the second display panel in a perpendicular direction to a side of the second substrate.

The display device may further include an insulating layer positioned between the second scan driver of the third display panel and the second scan driver of the second display panel.

The scan line of the third display panel extends to a rear side of the second region, and the scan line of the third display panel may directly contact the second scan driver of the first display panel.

The scan line of the third display panel may extend to a rear side of the second region, and the scan line of the third display panel may directly contact the second scan driver of the second display panel.

Another embodiment of the present invention provides a display device including a plurality of display panels neighboring each other, wherein the display panels include an overlapping area partly overlapping the neighboring display panel, a substrate of one display panel overlaps a substrate of the neighboring display panel in a perpendicular direction to a side of the substrate in the overlapping area, at least one scan driver is positioned between the overlapping substrates, and the scan driver is not visible from the outside of the display device.

The scan driver of the display device may be positioned on an edge of the display u) device, and the scan driver may not be visible from the outside in a region in which the display panels are connected to each other.

According to the embodiments, the display device in which a plurality of display panels are connected to each other may improve display quality.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
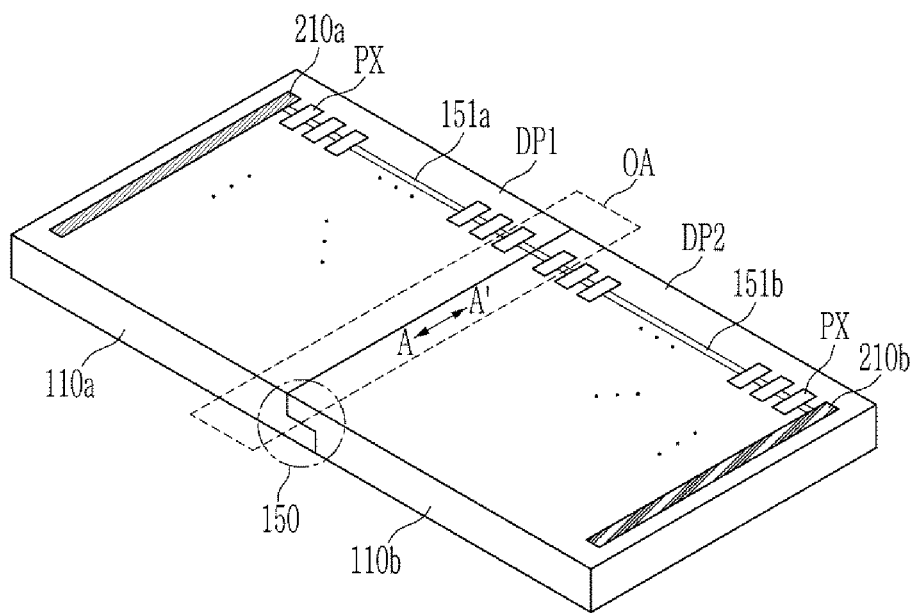
FIG. 1 illustrates a display device according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, when images are illustrated using the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," "third," etc. may be used herein to describe various types of elements, these elements should not be limited by these terms. These terms are used to distinguish one element from another element. Thus, a first element discussed below could be termed a second element or third element, etc. without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

The present invention will be described more fully hereinafter with reference to the accompanying drawings, in which embodiments of the invention are illustrated. As those skilled in the art would realize, the described embodiments may be modified in various different ways, all without departing from the spirit or scope of the present invention.

Parts that are irrelevant to the description will be omitted to clearly describe the present invention, and the same elements will be designated by the same reference numerals throughout the specification.

The size and thickness of each configuration illustrated in the drawings are arbitrarily illustrated for better understanding and ease of description, but the present invention is not limited thereto. In the drawings, the thickness of layers, films, panels, regions, etc., are exaggerated for clarity. The thicknesses of some layers and areas are exaggerated for convenience of explanation.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "in a plan view" means viewing an object portion from the top, and the phrase "in a cross-sectional view" means viewing a cross-section of which the object portion is vertically cut from the side.

A display device according to an embodiment of the present invention will now be described with reference to accompanying drawings.

FIG. 1 illustrates a display device according to an embodiment. Referring to FIG. 1, the display device may be a display device in which a plurality of display panels are sequentially disposed. That is, regarding a big-area display device, the big area may be realized by sequentially disposing a plurality of display panels instead of one big display panel.

Referring to FIG. 1, the display device includes a first display panel DP1 and a second display panel DP2.

The first display panel DP1 includes a first substrate 110a, a first scan driver 210a positioned on the first substrate 110a, a first scan line 151a connected from the first scan driver 210a, and a plurality of pixels PX connected to the first scan line 151a.

In a like manner, the second display panel DP2 includes a second substrate 110b, a second scan driver 210b positioned on the second substrate 110b, a second scan line 151b connected from the second scan driver 210b, and a plurality of pixels PX connected to the second scan line 151b.

For ease of description, FIG. 1 illustrates the configuration of the first scan driver 210a and the second scan driver 210b. A data driver, a data divider, and a timing controller may also be positioned on the first substrate 110a and the second substrate 110b. Also, for ease of illustration, the first and second scan lines 151a and 151b and the pixels PX are illustrated as one row, but they may be disposed on a plurality of rows.

Referring to FIG. 1, the first display panel DP1 and the second display panel DP2 overlap each other in a region in which the first display panel DP1 and the second display panel DP2 are connected to each other. An overlapping area (OA) of the first display panel DP1 and the second display panel DP2 is illustrated using a dotted line. The first substrate 110a and the second substrate 110b are connected using an L-shaped configuration 150 within the OA.

In conjunction with the L-shaped configuration, as illustrated in FIG. 1, a portion of the first substrate 110a of the first display panel DP1 in the overlapping area (OA) is thinner than portions of the first substrate 110a in non-overlapping areas. In a like manner, a portion of the second substrate 110b of the second display panel DP2 in the overlapping area (OA) is thinner than portions of the second substrate 110b non-overlapping areas. In this instance, a sum of thicknesses of the first substrate 110a and the second substrate 110b in the overlapping area (OA) may be similar to a thickness of the first substrate 110a or a thickness of the second substrate 110b in non-overlapping areas.

In an embodiment, a third scan driver may be respectively positioned in the overlapping area (OA) of the first display panel DP1 and the second display panel DP2. The third scan driver may be respectively positioned on a front side of the first substrate 110a of the first display panel DP1 and a rear side of the second substrate 110b of the second display panel DP2 in the overlapping area (OA). Therefore, the third scan driver may not be visible on the front side of the display device. The front side of the display device may refer to the side illustrated in FIG. 1 in which the first scan driver 210a, pixels PX, first scan line 151a, etc. are illustrated. A detailed formed shape of the second scan driver will be described in another part of the present specification with reference to FIG. 2 and FIG. 3.

Regarding the display device in which a plurality of display panels are connected to each other, gaps among the pixels PX may be different near the area occupied by the third scan driver on the connection portion of the first display panel DP1 and the second display panel DP2. However, as show illustrated n in FIG. 1, when the third scan driver is in the overlapping area of the first display panel DP1 and the second display panel DP2, it may be possible to maintain the gap among the pixels PX on the connection portion of the first display panel DP1 is and the second display panel DP2. The connection portion may refer to the OA.

Figure 2:
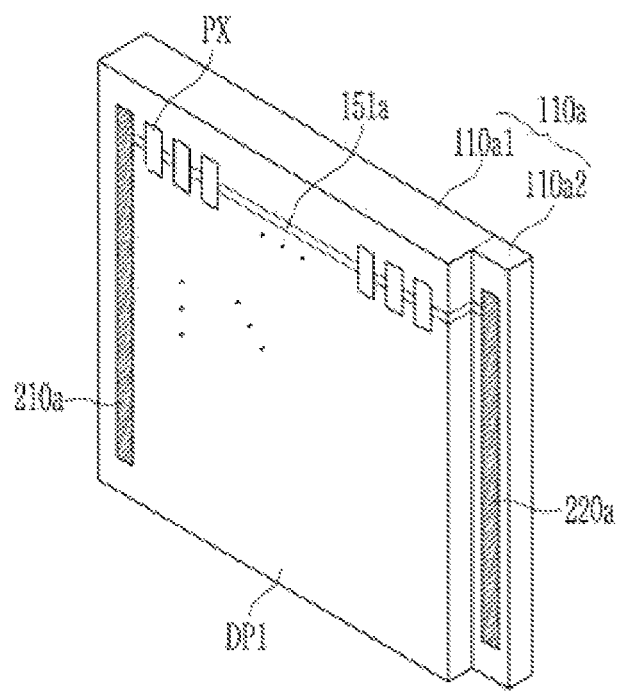
FIG. 2 illustrates a configuration of a first display panel described with reference to FIG. 1.

FIG. 2 illustrates a configuration of a first display panel DP1 described with reference to FIG. 1. Referring to FIG. 2, the first substrate 110a includes a first thick portion 110a1 and a first thin portion 110a2. The first thick portion 110a1 is a portion not overlapping the second display panel DP2, and a first scan driver 210a may be positioned on one edge of the first thick portion 110a1. The first scan driver 210a is connected to the first scan line 151a, and a plurality of pixels PX are positioned to be connected to the first scan line 151a. A third scan driver 220a is positioned on the first thin portion 110a2 of the first substrate 110a. The third scan driver 220a is also connected to the first scan line 151a. The pixel PX is not positioned on the first thin portion 110a2 of the first substrate 110a.

Illustrated with a dotted line D1, the first thin portion 110a2 may be formed in a single continuous body with the first substrate 110a. In other embodiments, the first thin portion 110a2 may be formed in a separate operation than the first substrate 110a.

Figure 3:
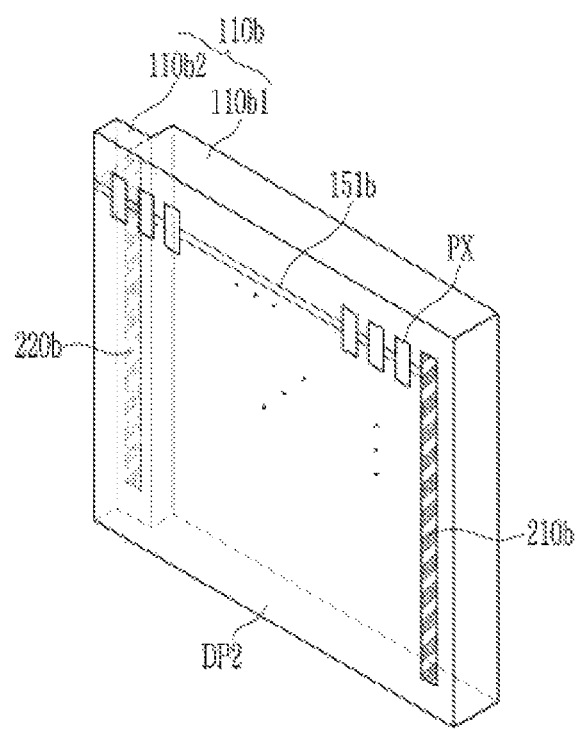
FIG. 3 illustrates a configuration of a second display panel described with reference to FIG. 1.

FIG. 3 illustrates a configuration of a second display panel DP2 described with reference to FIG. 1. Referring to FIG. 3, the second substrate 110b includes a thick second thick portion 110b1 and a thin second thin portion 110b2. The second thick portion 110b1 does not overlap the first display panel DP1, and a second scan driver 210b is positioned on one edge of the second thick portion 110b1. The second scan driver 210b is connected to the second scan line 151b, and a plurality of pixels PX are positioned to be connected to the second scan line 151b.

A fourth scan driver 220b is positioned on a rear side of the second thin portion 110b2 of the second substrate 110b. The fourth scan driver 220b may be connected to the second scan line 151b. The second scan line 151b may wrap around the second thin portion 110b2 and reach the rear side of the second thin portion 110b2 from the front side of the second thin portion 110b2 of the second substrate 110b over a lateral side of the second thin portion 110b2. Each pixel PX may be connected to the second scan line 151b positioned on the front side of the second thin portion 110b2.

The display device illustrated in FIG. 1 may be formed when the first display panel DP1 of FIG. 2 and the second display panel DP2 of FIG. 3 overlap each other in the OA and are connected to each other. In this instance, an insulating layer (IL) may be positioned on the OA between the first display panel DP1 and the second display panel DP2.

Figure 4:
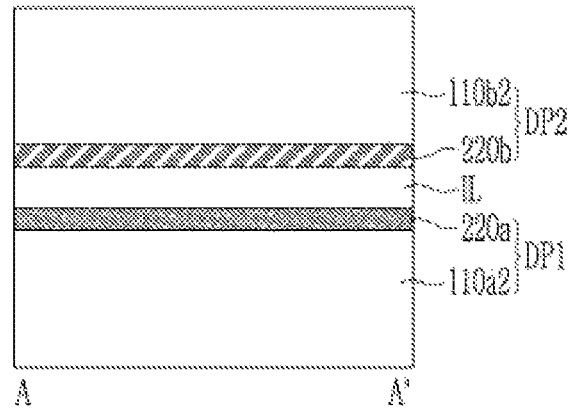
FIG. 4 illustrates a cross-section with respect to a line A-A' of FIG. 1.

FIG. 4 illustrates a cross-section with respect to a line A-A' of FIG. 1. FIG. 4 illustrates an overlapping shape of the respective third and fourth scan drivers 220a and 220b in the overlapping area (OA). That is, as illustrated in FIG. 4, the first display panel DP1 overlaps the second display panel DP2 in the overlapping area. The third scan driver 220a is positioned on the first thin portion 110a2 of the first substrate 110a of the first display panel DP1, and the fourth scan driver 220b is positioned on the second thin portion 110b2 of the second substrate 110b of the second display panel DP2.

As illustrated in FIG. 4, an insulating layer (IL) is positioned between the third scan driver 220a of the first display panel DP1 and the fourth scan driver 220b of the second is display panel DP2. Therefore, the third scan driver 220a of the first display panel DP1 may be insulated from the fourth scan driver 220b of the second display panel DP2.

When the first display panel DP1 and the second display panel DP2 are formed to overlap each other in the overlapping area OA, and the respective third and fourth scan drivers 220*a* and 220*b* are positioned in the overlapping area, a problem in which a disposal gap of the pixels PX that becomes different in the connection region of the display panel may be addressed.

Figure 5:
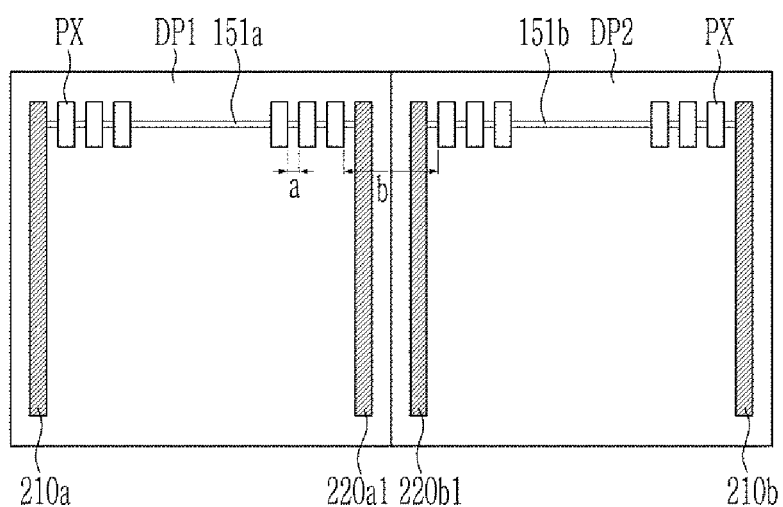
FIG. 5 illustrates a display device in which a first display panel does not overlap a second display panel.

FIG. 5 illustrates a display device in which a first display panel DP1 does not overlap a second display panel DP2. Referring to FIG. 5, a first scan driver 210*a* and a seventh scan driver 220*a*1 are positioned on respective edges of the first display panel DP1. Further, the second scan driver 210*b* and an eighth scan driver 220*b*1 are positioned on respective edges of the second display panel DP2.

Because the respective display panels have big areas, it is desired to dispose the scan drivers on the respective edges of the display panels. When the scan drivers are not positioned on the respective edges, image quality may be degraded because of deviation of charging rates of the respective pixels.

As the scan drivers are positioned on respective edges of the display panels, a gap between the pixels PX on the connection portion where the respective display panels are connected to each other may become different, as illustrated in FIG. 5. That is, as illustrated in FIG. 5, a pixel gap (b) between neighboring display panels becomes longer than a pixel gap (a) within one display panel.

Figure 6:
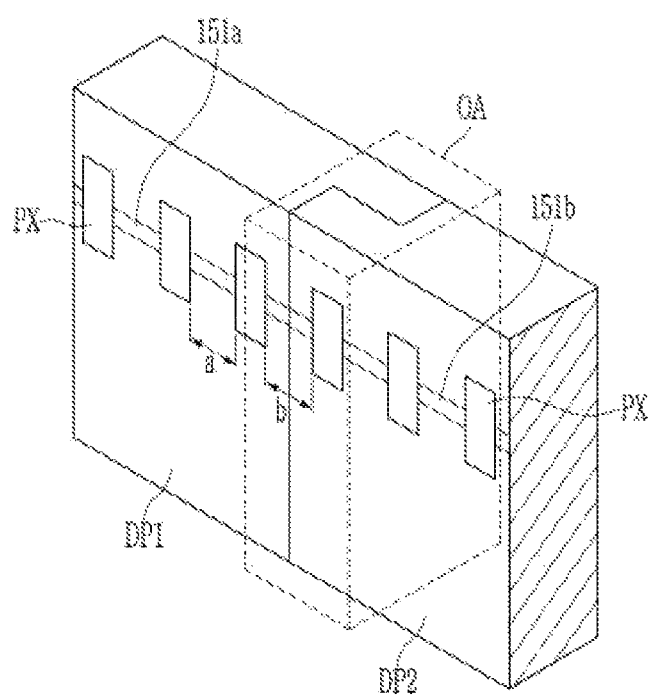
FIG. 6 illustrates part of a display device according to the present embodiment.

FIG. 6 illustrates part of a display device according to the present embodiment. Referring to FIG. 6, regarding the display device according to the present embodiment, the first display panel DP1 and the second display panel DP2 overlap each other in the overlapping area (OA). Further, the third scan driver of the first display panel DP1 and the fourth scan driver of the second display panel DP2 may be positioned in the overlapping area (OA) of the first display panel DP1 and the second display panel DP2 as illustrated in FIG. 1 to FIG. 3. The third scan driver is positioned in the overlapping area (OA) of the first display panel DP1 and the second display panel DP2 so it is not visible from the outside. Therefore, as illustrated in FIG. 6, the pixel gap (a) within one display panel and the pixel gap (b) between neighboring display panels may be substantially the same, thereby improving display quality. In this instance, a difference between the pixel gap (a) on the display panel and the pixel gap (b) between neighboring display panels may be less than 10%.

A display device according to another embodiment will now be described with reference to FIG. 7 to FIG. 9. According to an embodiment described with reference to FIG. 1 to FIG. 4, the first scan driver 210*a* and the third scan driver 220*a* are positioned on the first display panel DP1, and the second scan driver 210*b* and the fourth scan driver 220*b* are positioned on the second display panel DP2. However, according to an embodiment described with reference to FIG. 7 to FIG. 9, the configuration of the fourth scan driver 220*b* on the second display panel DP2 is omitted, and the second display panel DP2 may receive a signal from the third scan driver 220*a* of the first display panel DP1.

Figure 7:
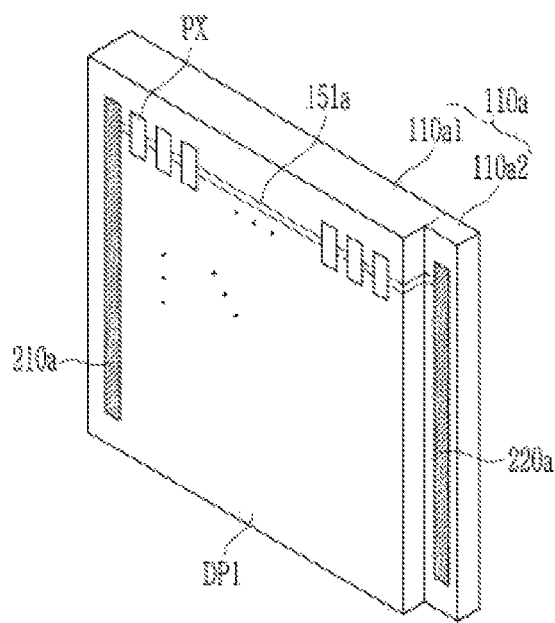
FIG. 7 illustrates a configuration of a first display panel in a display device according to another embodiment.

FIG. 7 illustrates a configuration of a first display panel DP1 in a display device according to the present embodiment. Referring to FIG. 7, the configuration of the first display panel DP1 corresponds to an embodiment described with reference to FIG. 1 to FIG. 4. That is, the first substrate 110*a* of the first display panel DP1 includes the first thick portion 110*a*1 and a first thin portion 110*a*2, a first scan driver 210*a* is positioned on the first thick portion 110*a*1, and a third scan driver 220*a* is positioned on the first thin portion 110*a*2. Other same constituent elements to will not be described.

Figure 8:
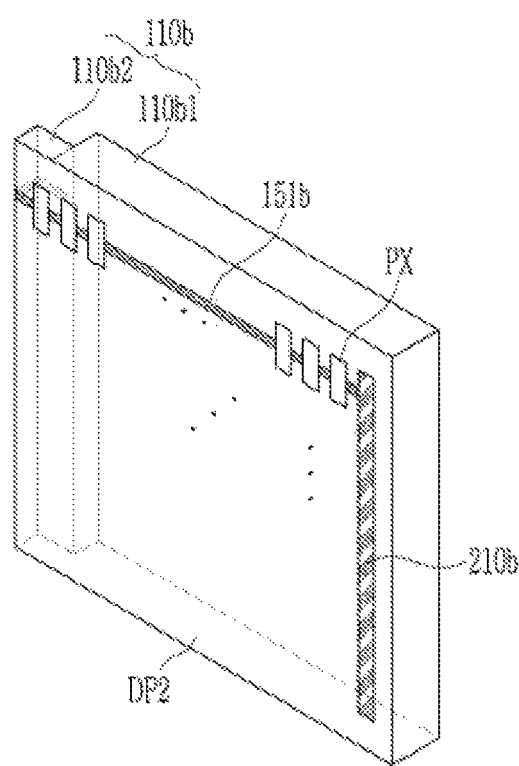
FIG. 8 illustrates a configuration of a second display panel in a display device according to the present embodiment.

FIG. 8 illustrates a configuration of a second display panel DP2 in a display device according to the present embodiment. Referring to FIG. 8, the second substrate 110*b* of the second display panel DP2 according to the present embodiment includes the second thick portion 110*b*1 and the second thin portion 110*b*2. The second scan driver 210*b* is positioned on one edge of the second thick portion 110*b*1. The second scan driver 210*b* is connected to the second scan line 151*b*, and a plurality of pixels PX are positioned to be connected to the second scan line 151*b*.

No scan driver is positioned on the second thin portion 110*b*2 of the second substrate 110*b*. That is, differing from an embodiment described with reference to FIG. 3, regarding the second display panel DP2 according to the present embodiment, the second scan driver 210*b* is positioned on the second thick portion 110*b*1 of the second substrate 110*b*, and a fourth scan driver is not positioned on the second thin portion 110*b*2. The second scan line 151*b* extends to the rear side of the second thin portion 110*b*2 of the second substrate 110*b* of the second display panel DP2, and the second scan line 151*b* may directly contact the third scan driver 220*a* of the first display panel DP1 and may receive a scan signal from the third scan driver 220*a*.

Figure 9:
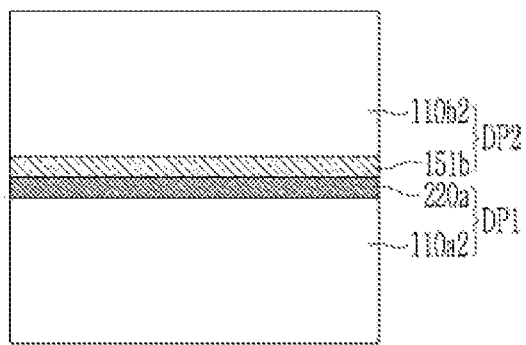
FIG. 9 illustrates a cross-section on a same position as FIG. 4.

FIG. 9 illustrates a cross-section on a same position as FIG. 4, illustrating a configuration in which the third scan driver 220*a* of the first display panel DP1 contacts the second scan line 151*b* of the second display panel DP2 in the overlapping area of the first display panel DP1 and the second display panel DP2.

Referring to FIG. 9, the third scan driver 220*a* is positioned on the first thin portion 110*a*2 of the first substrate 110*a* of the first display panel DP1. Further, the second scan line 151*b* is positioned on the second thin portion 110*b*2 of the second substrate 110*b* of the second display panel DP2.

As illustrated in FIG. 9, no insulating layer is positioned between the third scan driver 220*a* of the first display panel DP1 and the second scan line 151*b* of the second display panel DP2. The third scan driver 220*a* of the first display panel DP1 directly contacts the second scan line 151*b* of the second display panel DP2. Therefore, the second display panel DP2 may receive the scan signal of the third scan driver 220*a* of the first display panel DP1, and the configuration of the fourth scan driver of the second display panel DP2 may be omitted. Therefore, the configuration of the display device and the manufacturing process thereof may be simplified.

Figure 10:
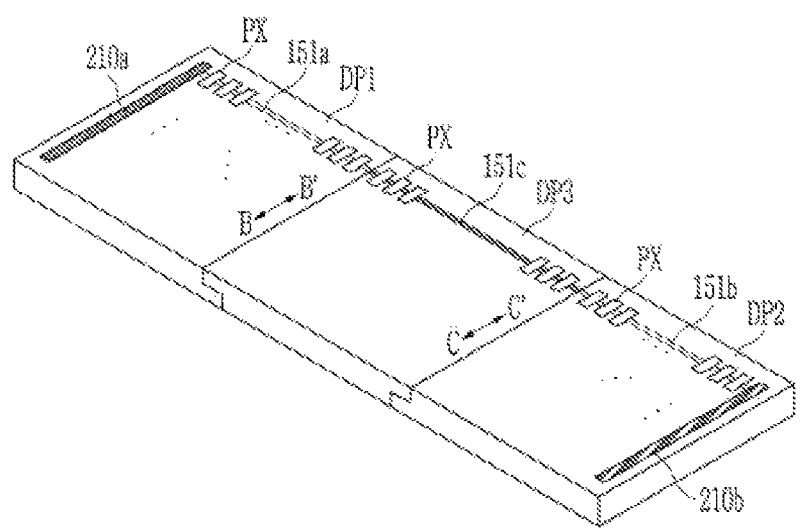
FIG. 10 illustrates a display device according to another embodiment.

FIG. 10 illustrates a display device according to another embodiment. The is embodiment described with reference to FIG. 10 corresponds to the embodiment described with reference to FIG. 1 to FIG. 4 except that the display device includes a first display panel DP1, a second display panel DP2, and a third display panel DP3. No same constituent elements will be described. As illustrated in FIG. 10, the third display panel DP3 is positioned between the first display panel DP1 and the second display panel DP2.

Figure 11:
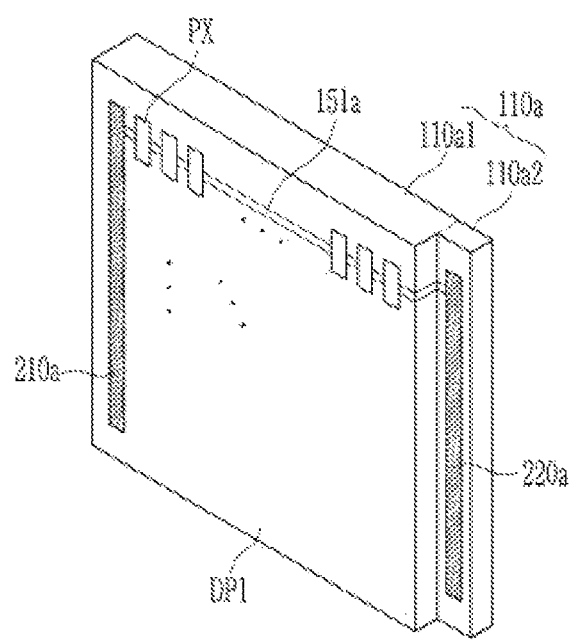
FIG. 11 illustrates a first display panel of FIG. 10.
Figure 12:
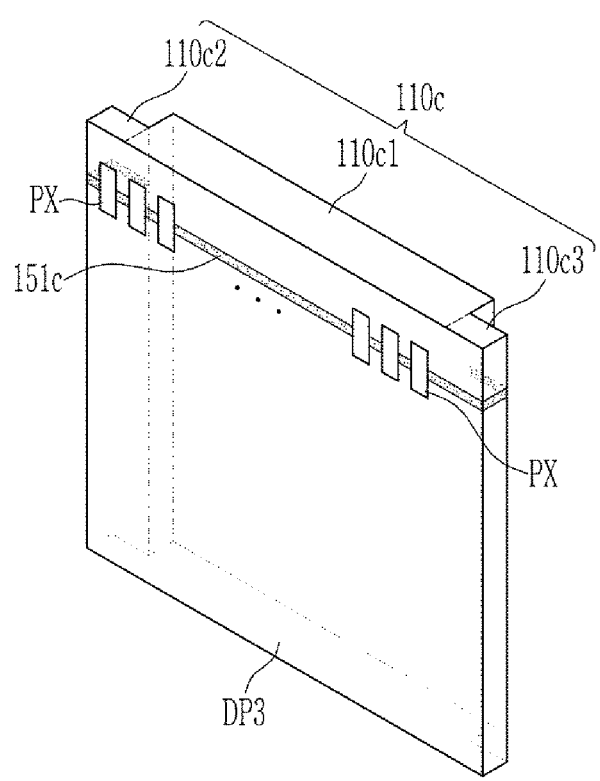
FIG. 12 illustrates a third display panel of FIG. 10.
Figure 13:
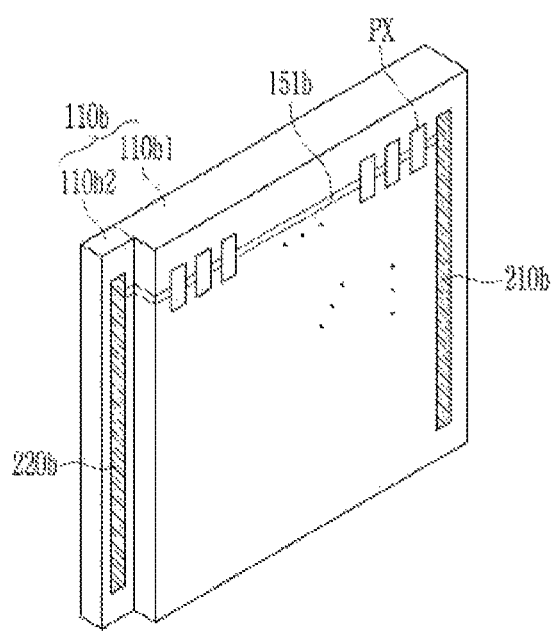
FIG. 13 illustrates a second display panel of FIG. 10.

FIG. 11 illustrates a first display panel DP1 of FIG. 10, FIG. 12 illustrates a third display panel DP3 of FIG. 10, and FIG. 13 illustrates a second display panel DP2 of FIG. 10.

Referring to FIG. 10 and FIG. 11, the configuration of the first display panel DP1 according to the present embodiment corresponds to the configuration described with reference to FIG. 2. Similar terms may be used as described in various places. That is, the first substrate 110*a* of the first display panel DP1 according to the present embodiment includes the first thick portion 110*a*1 and a first thin portion 110*a*2, and a first scan driver 210*a* is positioned on the first thick portion 110*a*1 and a third scan driver 220*a* is positioned on the first thin portion 110a2. To be additionally described, the third scan driver 220a of the first display panel DP1 may contact a third scan line 151c of the third display panel DP3 and may be directly connected to the same.

Referring to FIG. 10 and FIG. 12, the third display panel DP3 according to the present embodiment includes a third substrate 110c, and the third substrate 110c includes a third thick portion 110c1, a third thin portion 110c2, and a fourth thin portion 110c3. The third thin portion 110c2 and the fourth thin portion 110c3 of the third substrate 110c may be positioned on respective edges of the third thick portion 110c1.

Referring to FIG. 12, the third display panel DP3 does not include a scan driver. However, as illustrated in FIG. 12, the third scan line 151c extends on the rear side of the third thin portion 110c2 and fourth thin portion 110c3 of the third substrate 110c. To be described in detail hereinafter, the third display panel DP3 may receive a scan signal from the neighboring first display panel DP1 or the second display panel DP2 through the third scan line 151c.

FIG. 13 illustrates a second display panel DP2 of FIG. 10. Referring to FIG. 13, the configuration of the second display panel DP2 according to the present embodiment corresponds to what is described with reference to FIG. 3. No same constituent elements will be described.

That is, the second substrate 110b of the second display panel DP2 includes the second thick portion 110b1 and the second thin portion 110b2. The second thick portion 110b1 does not overlap the first display panel DP1, and a second scan driver 210b is positioned on one edge of the second thick portion 110b1. The second scan driver 210b is connected to the second scan line 151b, and a plurality of pixels PX are positioned to be connected to the second scan line 151b. The first scan line 151a may be connected to the third scan line 151c via the second scan line 151b. Though labeled separately for the understanding of the reader, they may all be considered part of a same scan line.

A fourth scan driver 220b is positioned on the second thin portion 110b2 of the second substrate 110b. The fourth scan driver 220b may be connected to the second scan line 151b. To be additionally described hereinafter, the fourth scan driver 220b of the second is display panel DP2 may be directly connected to the third scan line 151c of the third display panel DP3.

Figure 14:
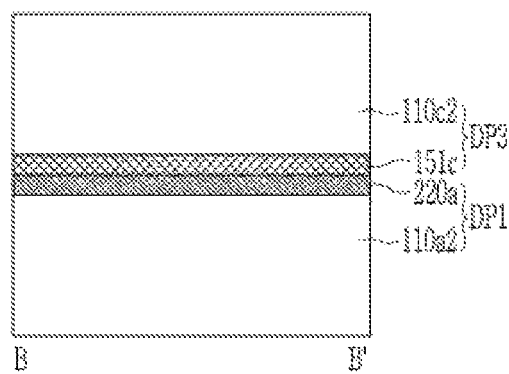
FIG. 14 illustrates a cross-section with respect to a line B-B' of FIG. 10.

FIG. 14 illustrates a cross-section with respect to a line B-B' of FIG. 10. Referring to FIG. 14, a third scan driver 220a is positioned on the first thin portion 110a2 of the first substrate 110a of the first display panel DP1. Further, the third scan line 151c is positioned on the third thin portion 110c2 and the fourth thin portion 110c3 of the third substrate 110c of the third display panel DP3. The third scan line 151c of the third display panel DP3 contacts the third scan driver 220a of the first display panel DP1. That is, the third scan line 151c of the third display panel DP3 contacts the third scan driver 220a of the first display panel DP1 on the rear side of the third thin portion 110c2 of the third substrate 110c, and may receive the scan signal therefrom.

Figure 15:
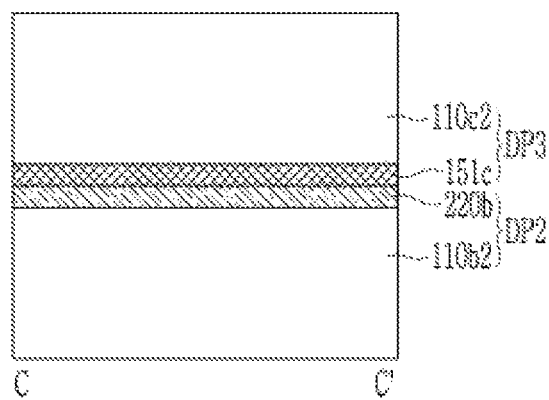
FIG. 15 illustrates a cross-section with respect to a line C-C' of FIG. 10.

FIG. 15 illustrates a cross-section with respect to a line C-C' of FIG. 10. Referring to FIG. 15, a fourth scan driver 220b is positioned on the second thin portion 110b2 of the second substrate 110b of the second display panel DP2, and near this, the third scan line 151c is positioned on the fourth thin portion 110c3 of the third substrate 110c of the third display panel DP3. That is, the third scan line 151c of the third display panel DP3 contacts the fourth scan driver 220b of the second display panel DP2 on the rear side of the fourth thin portion 110c3 of the third substrate 110c, and it may receive a scan signal therefrom.

That is, according to an embodiment described with reference to FIG. 10 to FIG. 15, the third display panel DP3 positioned between the first display panel DP1 and the second is display panel DP2 may not include an additional scan driver, and it may be respectively connected to the third scan driver 220a of the neighboring first display panel DP1 and the fourth scan driver 220b of the second display panel DP2 through the third scan line 151c to receive the scan signal. Therefore, no additional scan driver is positioned on the third display panel DP3, thereby simplifying the structure of the display device and also simplifying the manufacturing process.

FIG. 16 to FIG. 19 show a display device according to another embodiment. The display device of FIG. 16 to FIG. 19 includes a first display panel DP1, a second display panel DP2, and a third display panel DP3 positioned between the first display panel DP1 and the second display panel DP2, which corresponds to an embodiment described with reference to FIG. 10 to FIG. 15. No same constituent elements will be described.

Figure 16:
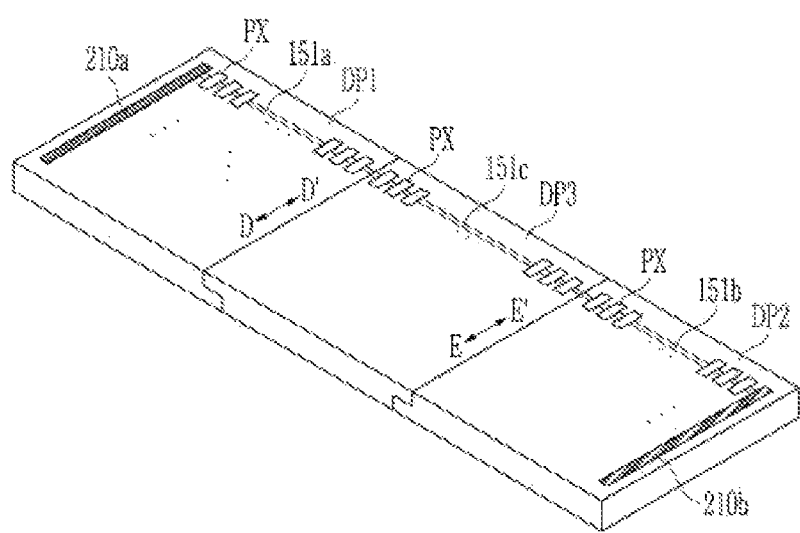
FIG. 16 illustrates a display device according to another embodiment.
Figure 17:
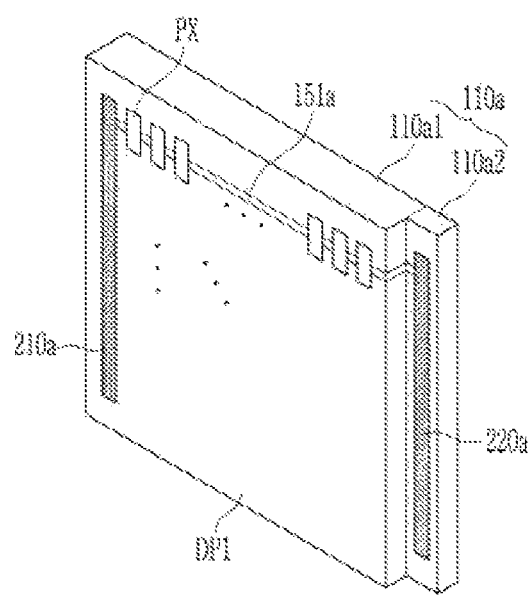
FIG. 17 illustrates a first display panel DP1 of FIG. 16.

FIG. 17 illustrates a first display panel DP1 of FIG. 16. Referring to FIG. 17, the configuration of the first display panel DP1 according to the present embodiment corresponds to the configuration described with reference to FIG. 2. No same constituent elements will be described. That is, the first substrate 110a of the first display panel DP1 according to the present embodiment includes the first thick portion 110a1 and a first thin portion 110a2, a first scan driver 210a is positioned on the first thick portion 110a1, and a third scan driver 220a is positioned on the first thin portion 110a2.

Figure 18:
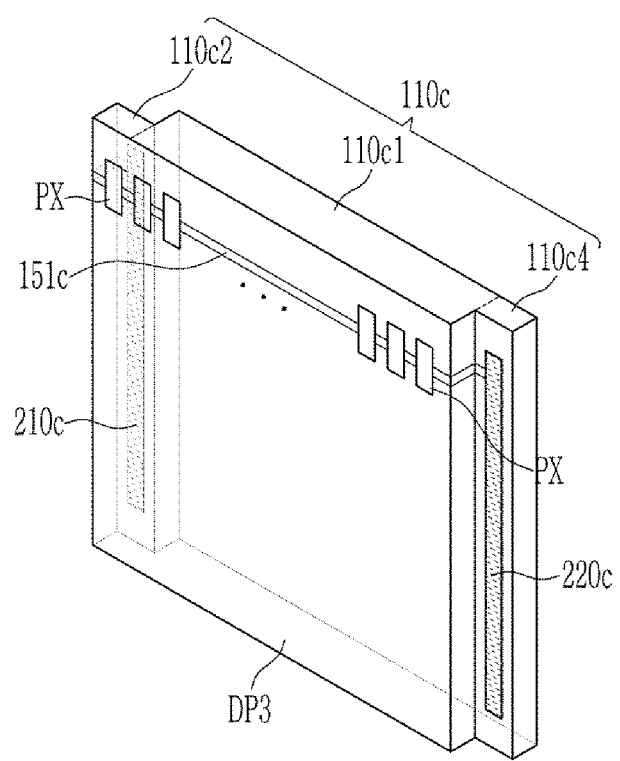
FIG. 18 illustrates a third display panel DP3 of FIG. 16.

FIG. 18 illustrates a third display panel DP3 of FIG. 16. Referring to FIG. 18, the third substrate 110c of the third display panel DP3 includes the third thick portion 110c1 and is the third thin portion 110c2 and a fifth thin portion 110c4. The third thin portion 110c2 may be positioned co-planar with the front side of the third display panel DP3. The fifth thin portion 110c4 may be disposed co-planar with the rear side of the third display panel DP3. The third thin portion 110c2 and the fifth thin portion 110c4 of the third substrate 110c may be positioned on respective edges of the third thick portion 110c1.

Referring to FIG. 18, a fifth scan driver 210c and a sixth scan driver 220c are positioned on the front side of the fifth thin portion 210c4 or the rear side of the third thin portion 110c2 positioned on respective edges of the third thick portion 110c1. As illustrated in FIG. 18, the fifth scan driver 210c may be positioned on the rear side of the third thin portion 110c2. Further, the sixth scan driver 220c may be positioned on the front side of the fifth thin portion 110c4. The fifth scan driver 210c is connected to the third scan line 151c, and the third scan line 151c is connected to the pixel PX. In a like manner, the sixth scan driver 220c is connected to the third scan line 151c, and the third scan line 151c is connected to the pixel PX.

Figure 19:
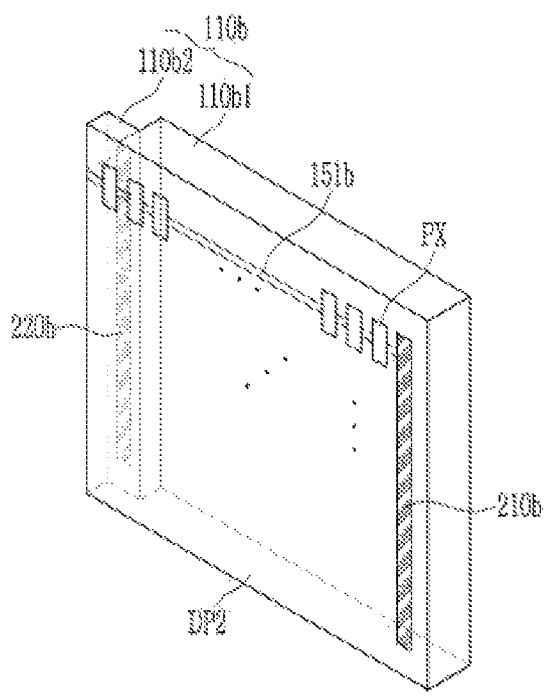
FIG. 19 illustrates a second display panel DP2 of FIG. 16.

FIG. 19 illustrates a second display panel DP2 of FIG. 16. Referring to FIG. 19, the configuration of the second display panel DP2 according to the present embodiment corresponds to the configuration described with reference to FIG. 3. No same constituent elements will be described. That is, the second substrate 110b of the second display panel DP2 includes the second thick portion 110b1 and a thin second thin portion 110b2. The second thick portion 110b1 does not overlap the first display panel DP1, and the second scan driver 210b is positioned on one edge of the second thick portion 110b1. The second scan driver 210b is is connected to the second scan line 151*b*, and a plurality of pixels PX are positioned to be connected to the second scan line 151*b*. A fourth scan driver 220*b* is positioned on the second thin portion 110*b*2 of the second substrate 110*b*. The fourth scan driver 220*b* may be connected to the scan line 151*b*.

Figure 20:
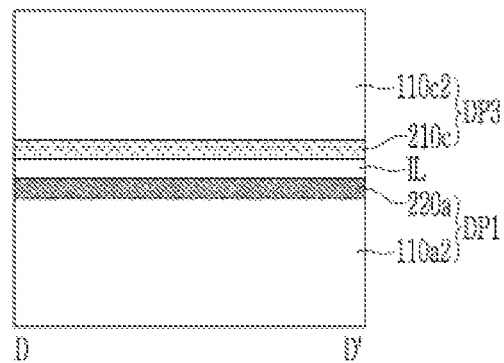
FIG. 20 illustrates a cross-section with respect to a line D-D' of FIG. 16.

FIG. 20 illustrates a cross-section with respect to a line D-D' of FIG. 16. Referring to FIG. 20, an insulating layer (IL) is positioned between the third scan driver 220*a* of the first display panel DP1 and the fifth scan driver 210*c* of the third display panel DP3. Therefore, the third scan driver 220*a* of the first display panel DP1 and the sixth scan driver 220*c* of the third display panel DP3 may be insulated.

Figure 21:
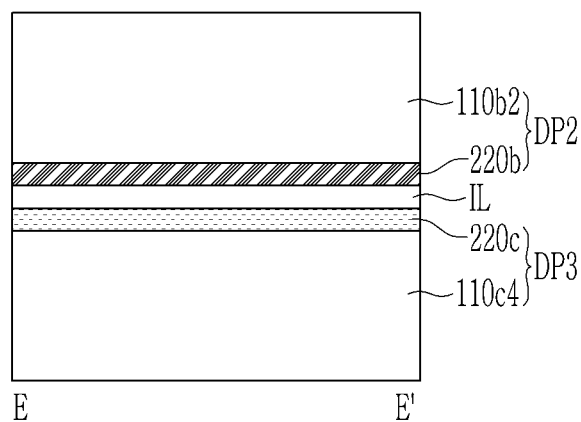
FIG. 21 illustrates a cross-section with respect to a line E-E' of FIG. 16.

FIG. 21 illustrates a cross-section with respect to a line E-E' of FIG. 16. Referring to FIG. 21, an insulating layer (IL) is positioned between the sixth scan driver 220*c* of the third display panel DP3 and the fourth scan driver 220*b* of the second display panel DP2. Therefore, the sixth scan driver 220*c* of the third display panel DP3 and the fourth scan driver 220*b* of the second display panel DP2 may be insulated.

Figure 22:
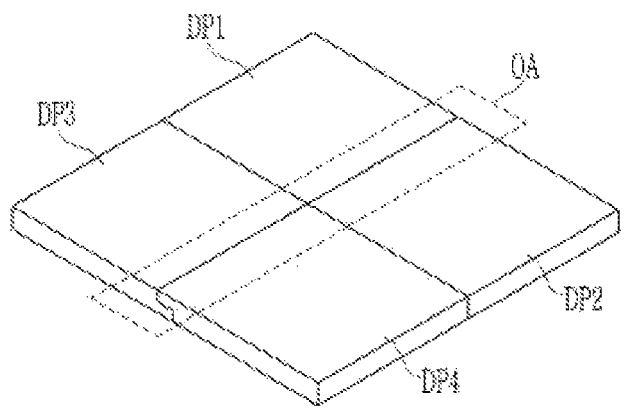
FIG. 22 illustrates a display device including a plurality of display panels.

FIG. 22 illustrates a display device including a plurality of display panels. FIG. 22 illustrates a display device including a first display panel DP1, a second display panel DP2, a third display panel DP3, and a fourth display panel DP4. This is, however, an example, and a number of display panels is modifiable. An overlapping shape of the display panel in the overlapping area (OA) in FIG. 22 may be one of FIG. 1 to FIG. 9.

Figure 23:
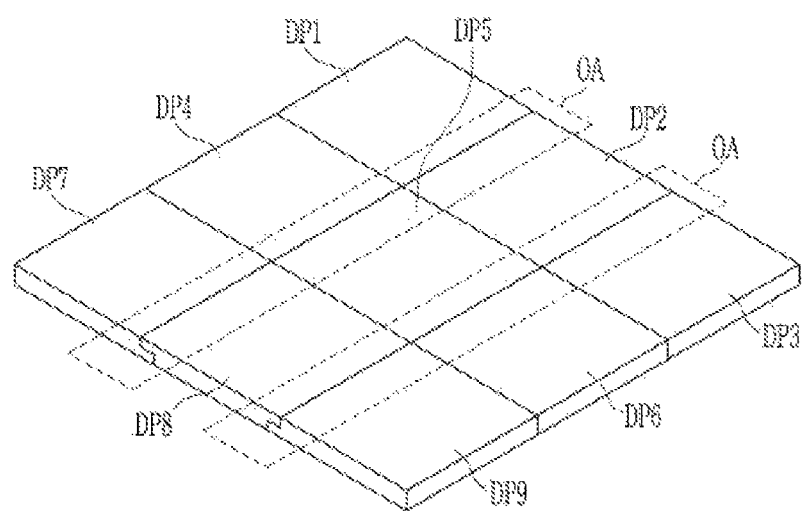
FIG. 23 illustrates a display device according to another embodiment.

FIG. 23 illustrates a display device according to another embodiment. Referring is to FIG. 23, the display device according to the present embodiment may be included. FIG. 23 illustrates a configuration including a first display panel DP1, a second display panel DP2, a third display panel DP3, a fourth display panel DP4, a fifth display panel DP5, a sixth display panel DP6, a seventh display panel DP7, an eighth display panel DP8, and a ninth display panel DP9, which may be an example, and the number of display panels may be variable. An overlapping shape of the display panel in the overlapping area (OA) of FIG. 23 may correspond to what is illustrated with reference to FIG. 10 to FIG. 15.

Figure 24:
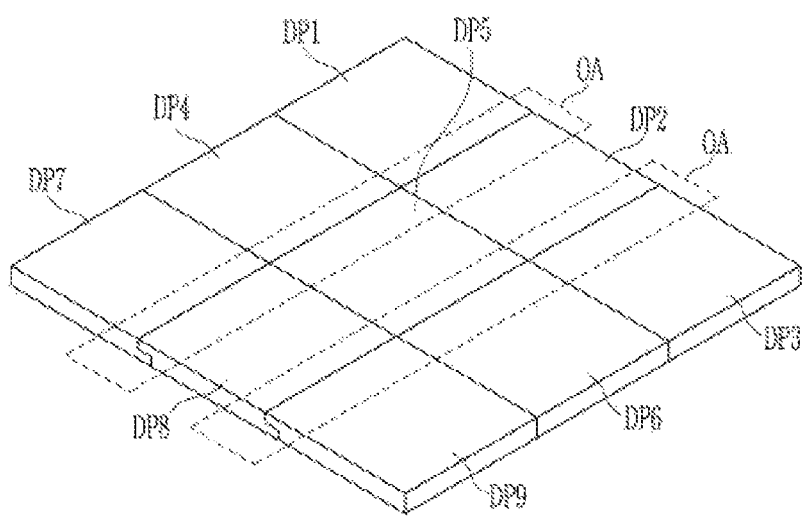
FIG. 24 illustrates a display device according to another embodiment.

FIG. 24 illustrates a display device according to another embodiment. Referring to FIG. 23, a display device according to the present embodiment may be included. FIG. 23 illustrates a configuration including a first display panel DP1, a second display panel DP2, a third display panel DP3, a fourth display panel DP4, a fifth display panel DP5, a sixth display panel DP6, a seventh display panel DP7, an eighth display panel DP8, and a ninth display panel DP9, which may be an example, and the number of display panels is changeable. An overlapping shape of the display panel in the overlapping area (OA) in FIG. 24 may correspond to what is illustrated with reference to FIG. 16 to FIG. 20.

Figure 25:
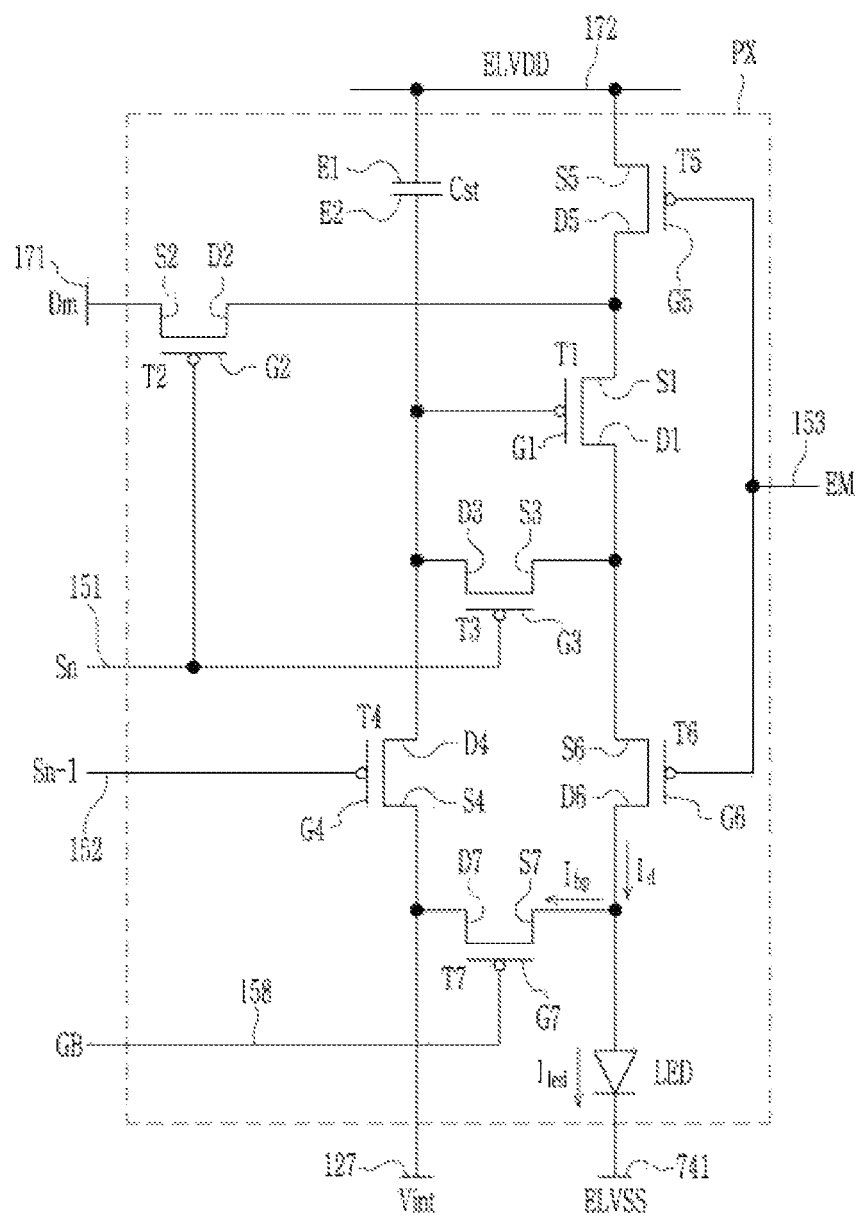
FIG. 25 illustrates an equivalent circuit diagram of one pixel PX in a display device according to an embodiment.

A circuit diagram of a pixel PX according to the present embodiment will now be described. FIG. 25 illustrates an equivalent circuit diagram of one pixel PX in a display device according to an embodiment. FIG. 25 is, however, an example, and the present invention is not limited thereto. The pixel PX may have various circuit diagrams in addition to what is illustrated in FIG. 25.

Referring to FIG. 25, the pixel PX of the emissive display device includes a plurality of transistors T1, T2, T3, T4, T5, T6, and T7 connected to various signal lines 127, 151, 152, 153, 158, 171, 172, and 741, a storage capacitor Cst, and a light emitting diode (LED).

The emissive display device includes a display area configured to display images, and the pixel PX is arranged in the display area in various forms.

A plurality of transistors T1, T2, T3, T4, T5, T6, and T7 include a driving transistor T1, include switching transistors connected to the scan line 151, that is, a second transistor T2 and a third transistor T3, and include other transistors (hereinafter, compensation transistors) configured to perform operations to operate the light emitting diode (LED). The compensation transistors (T4, T5, T6, and T7) may include a fourth transistor T4, a fifth transistor T5, a sixth transistor T6, and a seventh transistor T7.

A plurality of signal lines 127, 151, 152, 153, 158, 171, 172, and 741 may include a scan line 151, a previous-stage scan line 152, an emission control line 153, a bypass control line 158, a data line 171, a driving voltage line 172, an initialization voltage line 127, and a common voltage line 741. The bypass control line 158 may be part of the previous-stage scan line 152 or may be electrically connected thereto. In another way, the bypass control line 158 may be part of the scan line 151 or may be electrically connected thereto.

The scan line 151 is connected to the gate driver and transmits the scan signal (Sn) to the second transistor T2 and the third transistor T3. The previous-stage scan line 152 is connected to the gate driver and transmits a previous-stage scan signal Sn−1 applied to the pixel is PX positioned on a previous stage to the fourth transistor T4. The emission control line 153 is connected to an emission controller, and transmits an emission control signal (EM) configured to control a time for the light emitting diode (LED) to emit light to the fifth transistor T5 and the sixth transistor T6. The bypass control line 158 transmits a bypass signal (GB) to the seventh transistor T7.

The data line 171 is a wire to transmit a data voltage (Dm) generated by the data driver, and luminance of light emitted by the light emitting diode (LED) (also referred to as a light-emitting device) is changed according to the data voltage (Dm). The driving voltage line 172 applies a driving voltage (ELVDD). The initialization voltage line 127 transmits an initialization voltage (Vint) configured to initialize the driving transistor T1. The common voltage line 741 applies a common voltage (ELVSS). Voltages applied to the driving voltage line 172, the initialization voltage line 127, and the common voltage line 741 may be constant.

A plurality of transistors will now be described.

The driving transistor T1 controls a size of the current output according to the applied data voltage (Dm). The output driving current (Id) is applied to the light emitting diode (LED) to control brightness of the light emitting diode (LED) according to the data voltage (Dm). For this purpose, the first electrode S1 of the driving transistor T1 is disposed to receive the driving voltage (ELVDD). The first electrode S1 is connected to the driving voltage line 172 through the fifth transistor T5. Further, the first electrode S1 of the driving transistor T1 is connected to the second electrode D2 of the second transistor T2 to receive the data voltage is (Dm). The second electrode (D1, output electrode) of the driving transistor T1 is disposed to output the current to the light emitting diode (LED). The second electrode D1 of the driving transistor T1 is connected to the anode of the light emitting diode (LED) through the sixth transistor T6. In addition, the gate electrode G1 is connected to one electrode (second storage electrode) E2 of the storage capacitor Cst. The voltage at the gate electrode G1 changes according to the voltage stored in the storage capacitor Cst, and the driving current (Id) output by the driving transistor T1 changes.

The second transistor T2 receives the data voltage (Dm) into a pixel PX. The gate electrode G2 is connected to the scan line 151, and the first electrode S2 is connected to the data line 171. The second electrode D2 of the second transistor T2 is connected to the first electrode S1 of the driving transistor T1. When the second transistor T2 is turned on according to the scan signal (Sn) transmitted through the scan line 151, the data voltage (Dm) transmitted through the data line 171 is transmitted to the first electrode S1 of the driving transistor T1.

The third transistor T3 transmits the compensation voltage ((Dm+Vth) volts) changed when the data voltage (Dm) passes through the driving transistor T1 to the second storage electrode E2 of the storage capacitor Cst. The gate electrode G3 is connected to the scan line 151, and the first electrode S3 is connected to the second electrode D1 of the driving transistor T1. The second electrode D3 of the third transistor T3 is connected to the second storage electrode E2 of the storage capacitor Cst and the gate electrode G1 of the driving transistor T1. The third transistor T3 is turned on by the scan signal (Sn) received through the is scan line 151 to connect the gate electrode G1 of the driving transistor T1 and the second electrode D1, and to also connect the second electrode D1 of the driving transistor T1 and the second storage electrode E2 of the storage capacitor Cst.

The fourth transistor T4 initializes the gate electrode G1 of the driving transistor T1 and the second storage electrode E2 of the storage capacitor Cst. The gate electrode G4 is connected to the previous-stage scan line 152, and the first electrode S4 is connected to the initialization voltage line 127. The second electrode D4 of the fourth transistor T4 is connected to the second storage electrode E2 of the storage capacitor Cst and the gate electrode G1 of the driving transistor T1 through the second electrode D3 of the third transistor T3. The fourth transistor T4 transmits the initialization voltage (Vint) to the gate electrode G1 of the driving transistor T1 and the second storage electrode E2 of the storage capacitor Cst according to the previous-stage scan signal Sn−1 received through the previous-stage scan line 152. Accordingly, a gate voltage at the gate electrode G1 of the driving transistor T1 and the storage capacitor Cst are initialized. The initialization voltage (Vint) may have a low voltage value and may turn on the driving transistor T1.

The fifth transistor T5 transmits the driving voltage (ELVDD) to the driving transistor T1. The gate electrode G5 is connected to the emission control line 153, and the first electrode S5 is connected to the driving voltage line 172. The second electrode D5 of the fifth transistor T5 is connected to the first electrode S1 of the driving transistor T1.

The sixth transistor T6 transmits the driving current (Id) output by the driving is transistor T1 to the light emitting diode (LED). The gate electrode G6 is connected to the emission control line 153, and the first electrode S6 is connected to the second electrode D1 of the driving transistor T1. The second electrode D6 of the sixth transistor T6 is connected to the anode of the light emitting diode (LED).

The fifth transistor T5 and the sixth transistor T6 are simultaneously turned on by the emission control signal (EM) received through the emission control line 153, and when the driving voltage (ELVDD) is applied to the first electrode S1 of the driving transistor T1 through the fifth transistor T5, the driving transistor T1 outputs the driving current (Id) according to the voltage (i.e., the voltage at the second storage electrode E2 of the storage capacitor Cst) at the gate electrode G1 of the driving transistor T1. The output driving current (Id) is transmitted to the light emitting diode (LED) through the sixth transistor T6. The current ($I_{led}$) flows to the light emitting diode (LED), and the light emitting diode (LED) emits light.

The seventh transistor T7 initializes the anode of the light emitting diode (LED). The gate electrode G7 is connected to the bypass control line 158, the first electrode S7 is connected to the anode of the light emitting diode (LED), and the second electrode D7 is connected to the initialization voltage line 127. The bypass control line 158 may be connected to the previous-stage scan line 152, and a signal with the same timing as the previous-stage scan signal Sn−1 is applied as the bypass signal (GB). The bypass control line 158 is not connected to the previous-stage scan line 152, and it may transmit a signal that is different from the previous-stage scan signal Sn−1. When the seventh transistor T7 is turned on by the bypass is signal (GB), the initialization voltage (Vint) is applied to the anode of the light emitting diode (LED) to be initialized.

The first storage electrode E1 of the storage capacitor Cst is connected to the driving voltage line 172, and the second storage electrode E2 is connected to the gate electrode G1 of the driving transistor T1, the second electrode D3 of the third transistor T3, and the second electrode D4 of the fourth transistor T4. As a result, the second storage electrode E2 determines the voltage at the gate electrode G1 of the driving transistor T1, and it receives the data voltage (Dm) through the second electrode D3 of the third transistor T3 or receives the initialization voltage (Vint) through the second electrode D4 of the fourth transistor T4.

In addition, the anode of the light emitting diode (LED) is connected to the second electrode D6 of the sixth transistor T6 and the first electrode S7 of the seventh transistor T7, and the cathode is connected to the common voltage line 741 to transmit the common voltage (ELVSS).

The pixel circuit according to an embodiment described with reference to FIG. 25 includes seven transistors (T1 to T7) and one capacitor Cst, and without being limited thereto, the number of transistors and capacitors, and their connections, are modifiable in many ways.

FIG. 25 illustrates the configuration in which one light emitting diode (LED) is connected to the circuit of FIG. 25, and a light-emitting device group in which a plurality of light-emitting devices are connected to each other may be connected thereto.

While this invention has been described in connection with what is presently is considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a first display panel including:
    a first substrate including a first portion and a second portion that is thinner than the first portion,
    a first scan driver positioned on one edge of the first portion,
    a second scan driver positioned in the second portion, and
    a plurality of pixels connected to the first scan driver and the second scan driver by a scan line; and
    a second display panel including:
    a second substrate including a third portion and a fourth portion that is thinner than the third portion,
    a third scan driver positioned on one edge of the third portion, and
    a plurality of pixels connected to the third scan driver by a scan line,
    wherein the second portion of the first substrate, the second scan driver of the first display panel, and the fourth portion of the second substrate overlap each other in a perpendicular direction to a side of the first substrate, and wherein the second scan driver of the first display panel is not visible from outside of the display device.

2. The display device of claim 1, wherein
the second scan driver of the first display panel is positioned between the second portion of the first substrate and the fourth portion of the second substrate.

3. The display device of claim 1, wherein
the second scan driver of the first display panel is positioned on a rear side of the fourth portion of the second display panel.

4. The display device of claim 3, further comprising
an insulating layer positioned between the second scan driver of the first display panel and the second scan driver of the second display panel.

5. The display device of claim 3, wherein
the second scan driver of the second display panel is not visible from the outside of the display device.

6. The display device of claim 1, wherein
the scan line of the second display panel extends to a rear side of the second portion, and
the scan line of the second display panel directly contacts the second scan driver of the first display panel.

7. The display device of claim 6, wherein
the scan line of the second display panel is positioned between the second scan driver of the first display panel and the second portion of the second display panel.

8. The display device of claim 1, wherein
the pixel is positioned in the first portion and is not positioned in the second portion on the first display panel, and
the pixel is positioned in the third portion and the fourth portion on the second display panel.

9. The display device of claim 1, wherein
a difference between a gap among pixels positioned on the first display panel and a gap between a pixel positioned on the first display panel and a pixel positioned on the second display panel that neighbor each other near an overlapping portion of the first display panel and the second display panel is equal to or less than 10%.

10. A display device comprising:
a first display panel;
a second display panel; and
a third display panel positioned between the first display panel and the second display panel,
wherein the first display panel includes
a first substrate including a first region and a second region that is thinner than the first region,
a first scan driver positioned on one edge of the first region,
a second scan driver positioned in the second region, and
a plurality of pixels connected to the first scan driver and the second scan driver by a scan line,
wherein the second display panel includes
a second substrate including a third region and a fourth region that is thinner than the third region,
the second scan driver positioned on one edge of the third region, a plurality of pixels connected to the first scan driver by a scan line,
wherein the third display panel includes
a third substrate including a fifth region and sixth and seventh regions that are thinner than the fifth region,
a first scan line positioned on the third substrate, and
a plurality of pixels connected to the first scan line,
wherein the sixth and seventh regions of the third substrate are positioned on respective edges of the first region of the first substrate,
wherein the second region of the first substrate, the second scan driver of the first display panel, and the sixth and seventh regions of the third substrate overlap each other in a perpendicular direction to a side of the first substrate, and
the second scan driver of the first display panel is not visible from outside of the display device.

11. The display device of claim 10, wherein
the fourth region of the second substrate and the sixth region of the third substrate overlap each other in a perpendicular direction to a side of the first substrate.

12. The display device of claim 10, wherein
the second scan driver of the first display panel is positioned between the second region of the first substrate and the sixth region of the third substrate.

13. The display device of claim 10, further comprising
a first scan driver positioned on a rear side of the sixth region of the third substrate,
wherein the first scan driver of the third display panel overlaps the second scan driver of the first display panel in a perpendicular direction to a side of the first substrate.

14. The display device of claim 13, further comprising
an insulating layer positioned between the second scan driver of the first display panel and the first scan driver of the third display panel.

15. The display device of claim 10, further comprising:
a second scan driver positioned in the seventh region of the third display panel; and
a second scan driver positioned on a rear side of the fourth region of the second display panel,
wherein the second scan driver of the third display panel overlaps the second scan driver of the second display panel in a perpendicular direction to a side of the second substrate.

16. The display device of claim 15, further comprising
an insulating layer positioned between the second scan driver of the third display panel and the second scan driver of the second display panel.

17. The display device of claim 10, wherein
the scan line of the third display panel extends to a rear side of the seventh region, and
the scan line of the third display panel directly contacts the second scan driver of the first display panel.

18. The display device of claim 10, wherein
the scan line of the third display panel extends to a rear side of the seventh region, and
the scan line of the third display panel directly contacts the second scan driver of the second display panel.

* * * * *